(12) United States Patent
Schrinksy et al.

(10) Patent No.: US 7,326,647 B2
(45) Date of Patent: Feb. 5, 2008

(54) DRY ETCHING PROCESS TO FORM A CONDUCTIVE LAYER WITHIN AN OPENING WITHOUT USE OF A MASK DURING THE FORMATION OF A SEMICONDUCTOR DEVICE

(75) Inventors: Alex J. Schrinksy, Boise, ID (US); Mark E. Jost, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/214,554

(22) Filed: Aug. 30, 2005

(65) Prior Publication Data

US 2007/0049038 A1 Mar. 1, 2007

(51) Int. Cl.
*H01L 21/8242* (2006.01)

(52) U.S. Cl. .......... 438/639; 438/706; 257/E21.017

(58) Field of Classification Search ............ 438/706, 438/239, 637, 639
See application file for complete search history.

(56) References Cited

U.S. PATENT DOCUMENTS

| | | | | |
|---|---|---|---|---|
| 6,617,222 | B1 | 9/2003 | Coursey | 438/398 |
| 6,770,565 | B2 * | 8/2004 | Olgado et al. | 438/706 |
| 6,790,725 | B2 | 9/2004 | Coursey | 438/253 |
| 2003/0045113 | A1 * | 3/2003 | Enomoto et al. | 438/706 |
| 2003/0080395 | A1 | 5/2003 | Beasom | 257/565 |

* cited by examiner

*Primary Examiner*—W. David Coleman

(57) ABSTRACT

A method for use in fabrication of a semiconductor device comprises forming a conformal conductive layer over a planarized surface of a dielectric layer, and within an opening formed in the dielectric layer. The opening will typically have an aspect ratio of about 4:1 or greater. An etch is performed with specified gasses under a range of specified conditions which removes the conformal conductive layer from the planarized surface, but which leaves unetched the conformal conductive layer within the opening.

26 Claims, 11 Drawing Sheets

DRY ETCHING PROCESS TO FORM A CONDUCTIVE LAYER WITHIN AN OPENING WITHOUT USE OF A MASK DURING THE FORMATION OF A SEMICONDUCTOR DEVICE

FIELD OF THE INVENTION

This invention relates to the field of semiconductor manufacture and, more particularly, to a dry etch method for selectively removing a conformal conductive layer from an upper surface of a dielectric layer without removing the material from an opening within the layer and without forming a mask layer.

BACKGROUND OF THE INVENTION

During the manufacture of a semiconductor device comprising memory, several features are commonly formed, such as container capacitors and contacts to underlying conductive features. Methods of formation of these structure often comprise the use of mechanical planarization such as chemical mechanical planarization (CMP).

For example, one method to form a container capacitor bottom plate using CMP is depicted in FIGS. 1-6. FIG. 1 depicts a semiconductor wafer substrate assembly 10 comprising a semiconductor wafer 12 having a plurality of doped source/drain areas 14 which are electrically coupled with a plurality of transistors 16. Each transistor comprises gate oxide 18, a doped polysilicon control gate 20, silicide 22 such as tungsten silicide to increase conductivity of the control gate, and a capping layer 24 of oxide, for example formed using tetraethyl orthosilicate (TEOS). Silicon nitride spacers 26 insulate the control gate 20 and silicide 22 from polysilicon pads 28 to which the container capacitors will be electrically coupled. Further depicted in FIG. 1 is shallow trench isolation (STI, field oxide) 30 which reduces unwanted electrical interaction between adjacent transistors, and a thick layer of deposited oxide 32 such as borophosphosilicate glass (BPSG). A patterned photoresist layer 34 defines the location of the container capacitors to be formed. The FIG. 1 structure may further include other structural elements or differences which, for simplicity of explanation, have not been depicted.

The FIG. 1 structure is subjected to an anisotropic etch which removes the exposed portions of the BPSG layer 32 to form a patterned BPSG layer as depicted in FIG. 2 which provides a base dielectric 32 having a recess for the container capacitor. During this etch, the polysilicon pads 28 and possibly a portion of TEOS capping layer 24 are exposed as depicted in FIG. 2. The remaining photoresist layer 34 is stripped and any polymer (not depicted) which forms during the etch is removed according to means known in the art to provide the FIG. 3 structure.

As depicted in FIG. 4, a conformal conductive layer 40 is formed on the deposited oxide layer 32, and will provide a container capacitor storage node (bottom electrode, bottom capacitor plate) for the completed capacitor. Layer 40 may be a metal layer such at titanium nitride (TiN), a conductive layer comprising metal, or a conductively doped semiconductor. A filler material 42 such as photoresist is formed to fill the containers provided by conductive layer 40. The FIG. 4 structure is then subjected to a planarizing process, such as CMP. This process removes horizontal portions of the photoresist 42, the conductive layer 40, and likely a portion of the BPSG 32 to result in the FIG. 5 structure comprising the container capacitor bottom electrodes 40. The photoresist 42 is removed, for example using an ashing process, and then wafer processing continues to form a completed container capacitor and a functional semiconductor device.

Using CMP to form a structure such as a capacitor bottom plate may result in various problems. For example, complete removal of the conductive layer 40 of FIG. 4 from the upper horizontal portions of layer 32 is required to form discrete bottom electrodes to prevent shorting of the completed capacitors. To ensure electrical isolation between bottom electrodes, an over polish is typically performed. This over polish will decrease the height of the electrode, resulting in decreased capacitance of the completed capacitor. As bottom electrodes are formed at aspect ratios which push processing capabilities, merely forming taller electrodes to compensate for the polishing loss is not desirable.

Further, the formation and removal of resist 42 requires several process steps. For example, after formation of the conductive layer 40 the wafer must be transported from the deposition chamber to a coat track apparatus, where the photoresist is dispensed onto the surface of the spinning wafer, which is then heated to bake out the solvents. The wafer is then transported a CMP apparatus to planarize the surface of the FIG. 4 structure to remove the horizontal portions of the photoresist 42 and the conductive layer 40, then the wafer is cleaned. The wafer is then transported for a manual inspection, and is then again transported to measure the films for process control. After measuring the layers on the wafer, it is transported for a final surface clean to ensure sufficient clearance of conductive layer 40. Finally, the wafer is transported for ashing and removal of the remaining photo resist.

Transporting the wafer for various processing acts associated with the planarization of conductive layer 40, and the processing itself, requires time and material, may result added defects or product loss, and therefore increases device costs. Further, the CMP over polish required to ensure removal of the conductive layer 40 from the upper surface of the dielectric layer may result in decreased capacitance of the completed capacitor by decreasing the overall height of the bottom plate. A method used to form container capacitor storage plates and other features which reduces or eliminates the problems described above would be desirable.

SUMMARY OF THE INVENTION

The present invention provides a method which, among other advantages, reduces problems associated with the manufacture of semiconductor devices, particularly problems resulting from planarizing an upper surface of a conformal layer using conventional methods such as chemical mechanical planarization. In accordance with one embodiment of the invention a dielectric layer is formed having a planarized upper surface. One or more openings are etched into the dielectric layer, wherein each opening comprises substantially vertically-oriented cross-sectional sidewalls and a substantially horizontally-oriented bottom. A conformal conductive layer, such as a titanium metal, a layer comprising titanium, or a conductively doped polysilicon layer is formed to cover the surface of the dielectric layer, both outside and inside each opening. Next, an etch comprising a specified etchant and ranges of specified etching parameters is performed which removes the exposed conductive layer from the upper planarized surface of the dielectric layer, while leaving the exposed conductive layer formed along the cross sectional sidewalls of each opening and at the bottom of each opening unetched or substantially unetched.

The specified etchant and etch conditions allow the entire conductive layer to be exposed during the removal of the conductive layer from the upper horizontal surface of the dielectric layer. Removal of the conductive layer outside the opening may be effected with only minimal etching, or with no etching, of the conductive layer within each opening. This process may enable etching outside the opening with no measurable etching of the dielectric layer, although other embodiments are described which provide for some desirable etching of the dielectric layer.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which may be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein. The term "about" indicates that the value listed may be somewhat altered, as long as the alteration does not result in an excessive negative impact to the process or structure.

Figure 1:
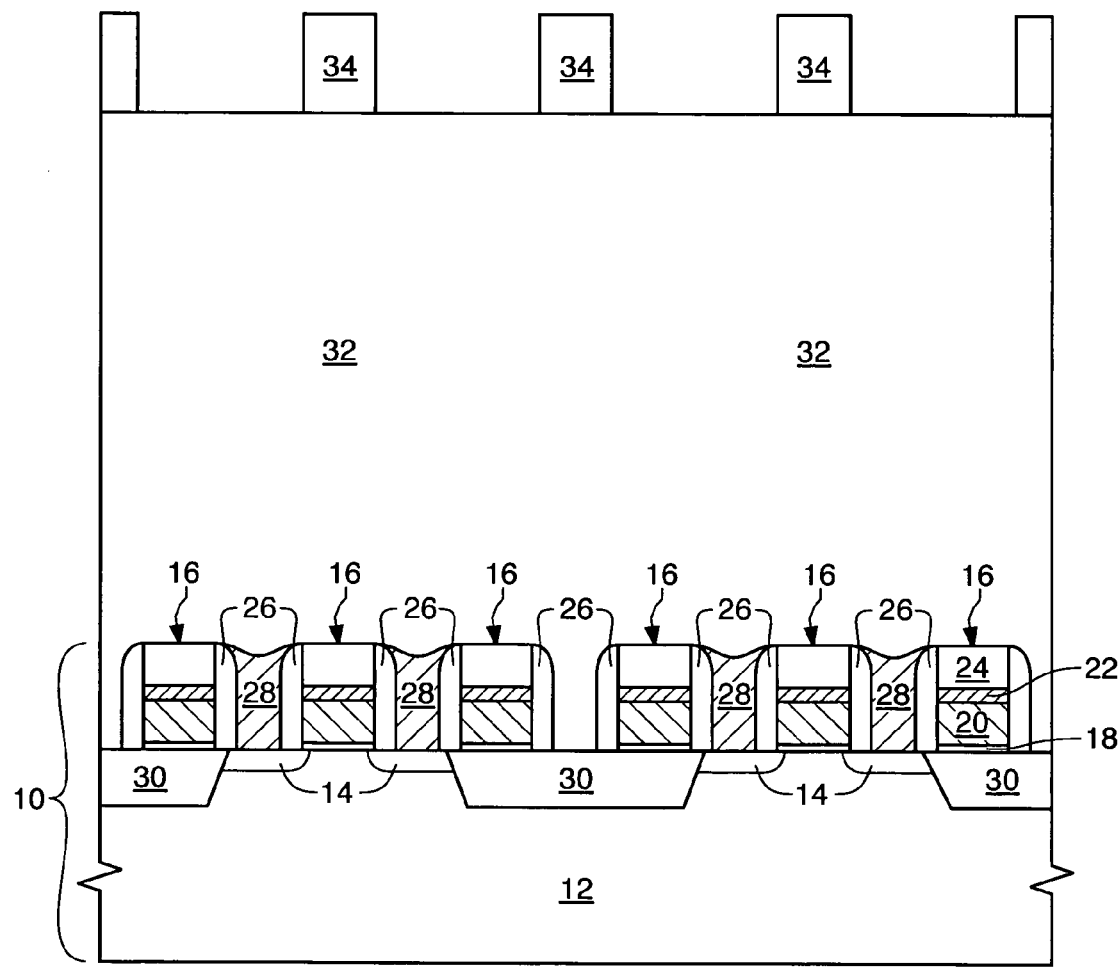
FIGS. 1-5 are cross sections depicting a conventional method for forming a capacitor bottom plate.
Figure 2:
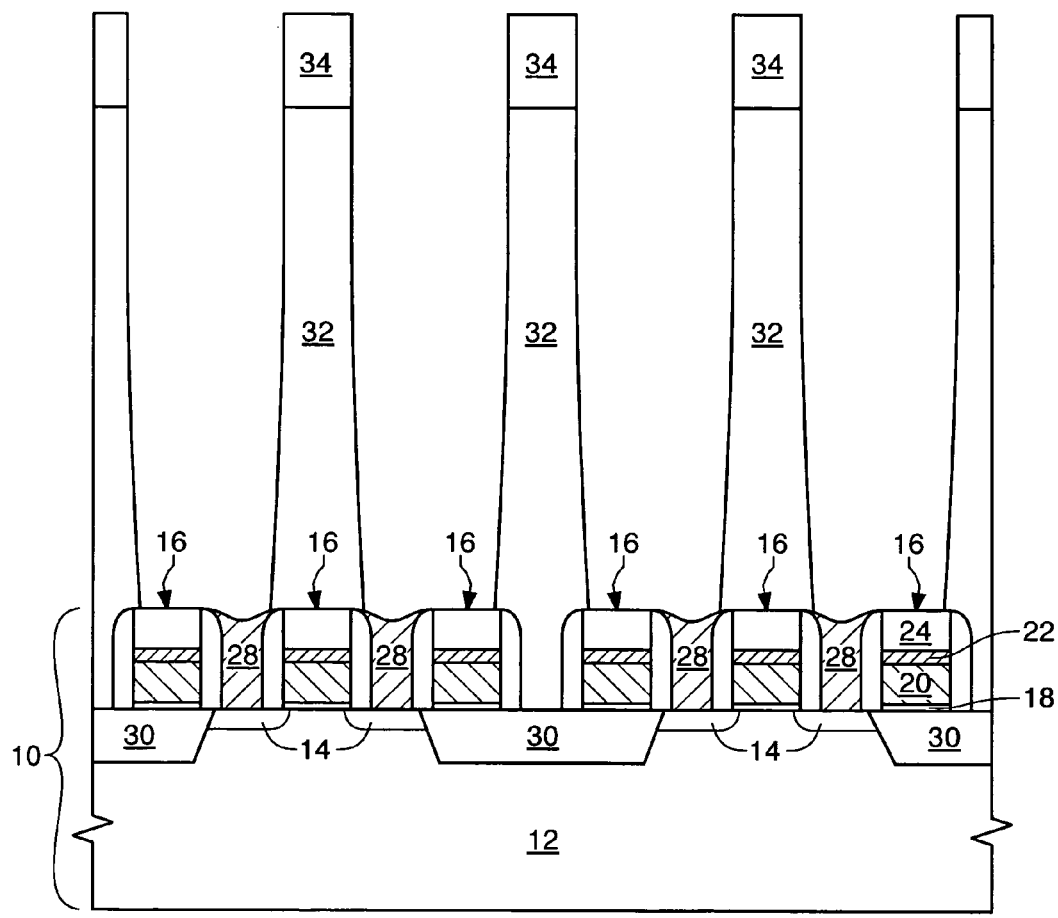
Figure 3:
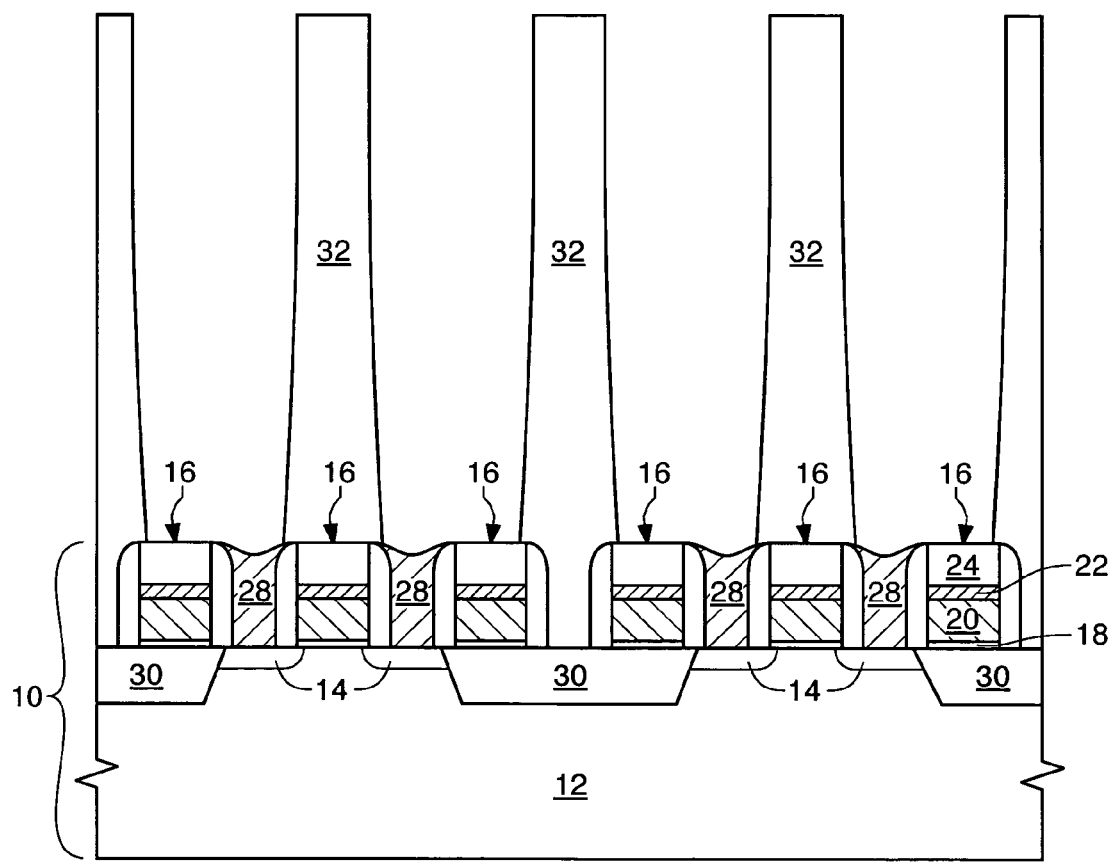
Figure 4:
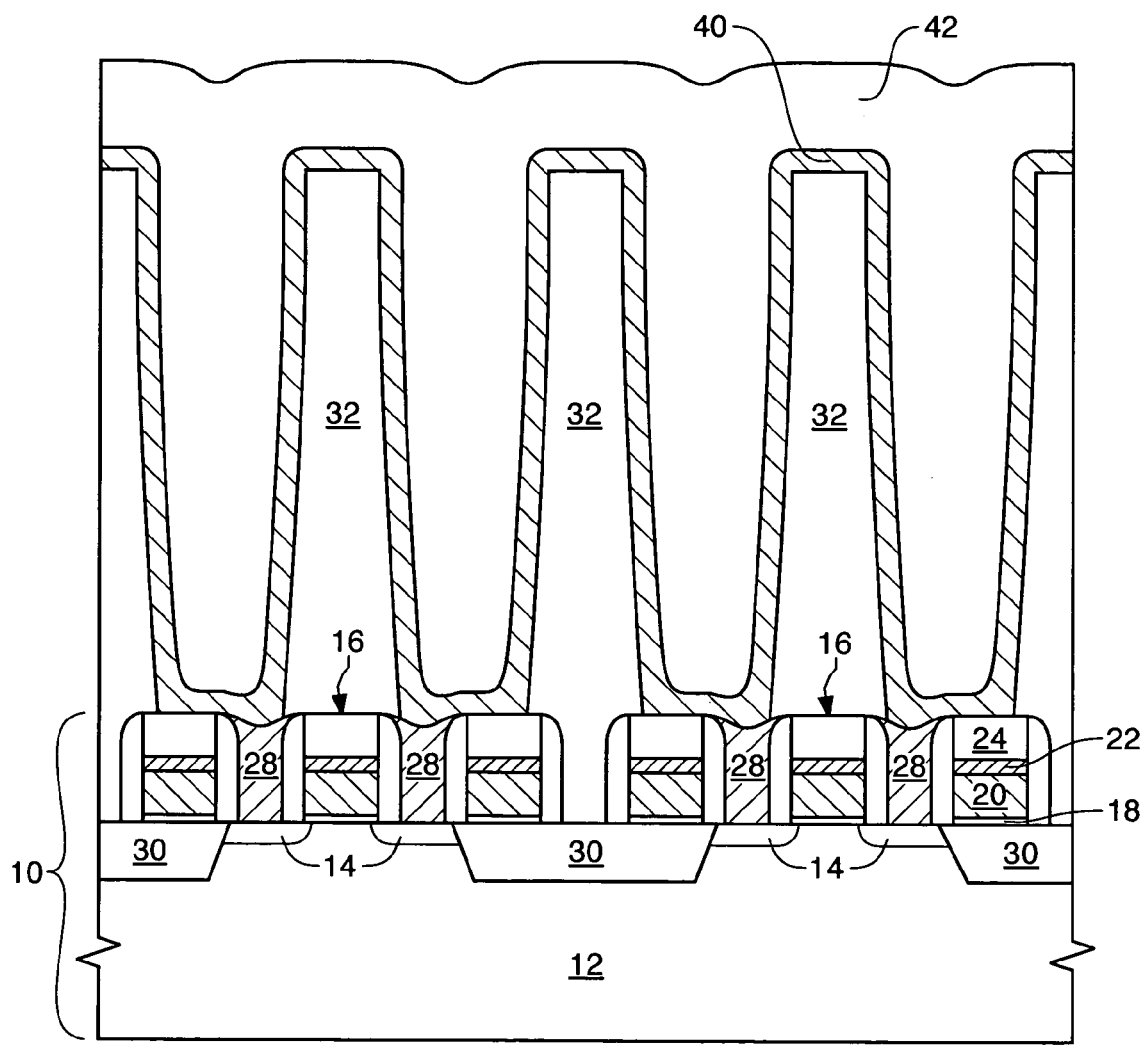
Figure 5:
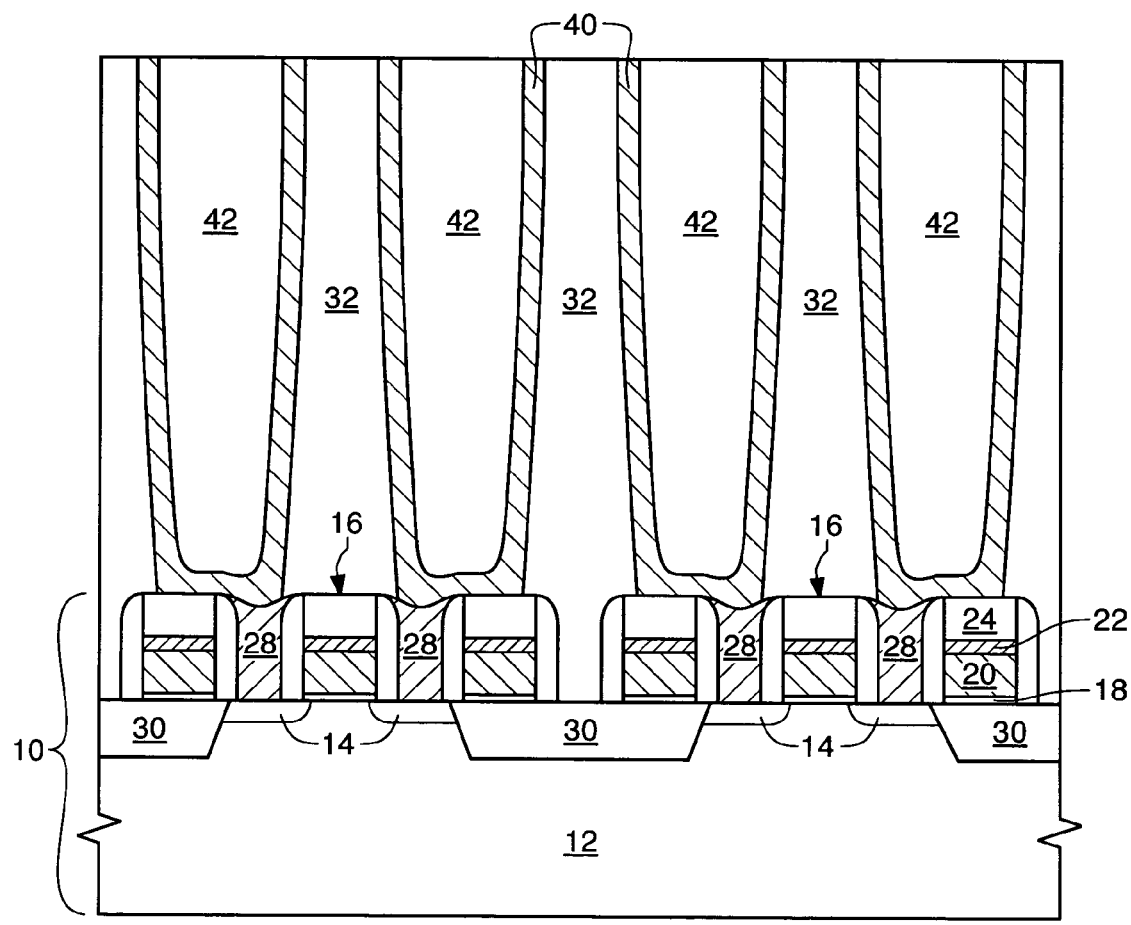
Figure 6:
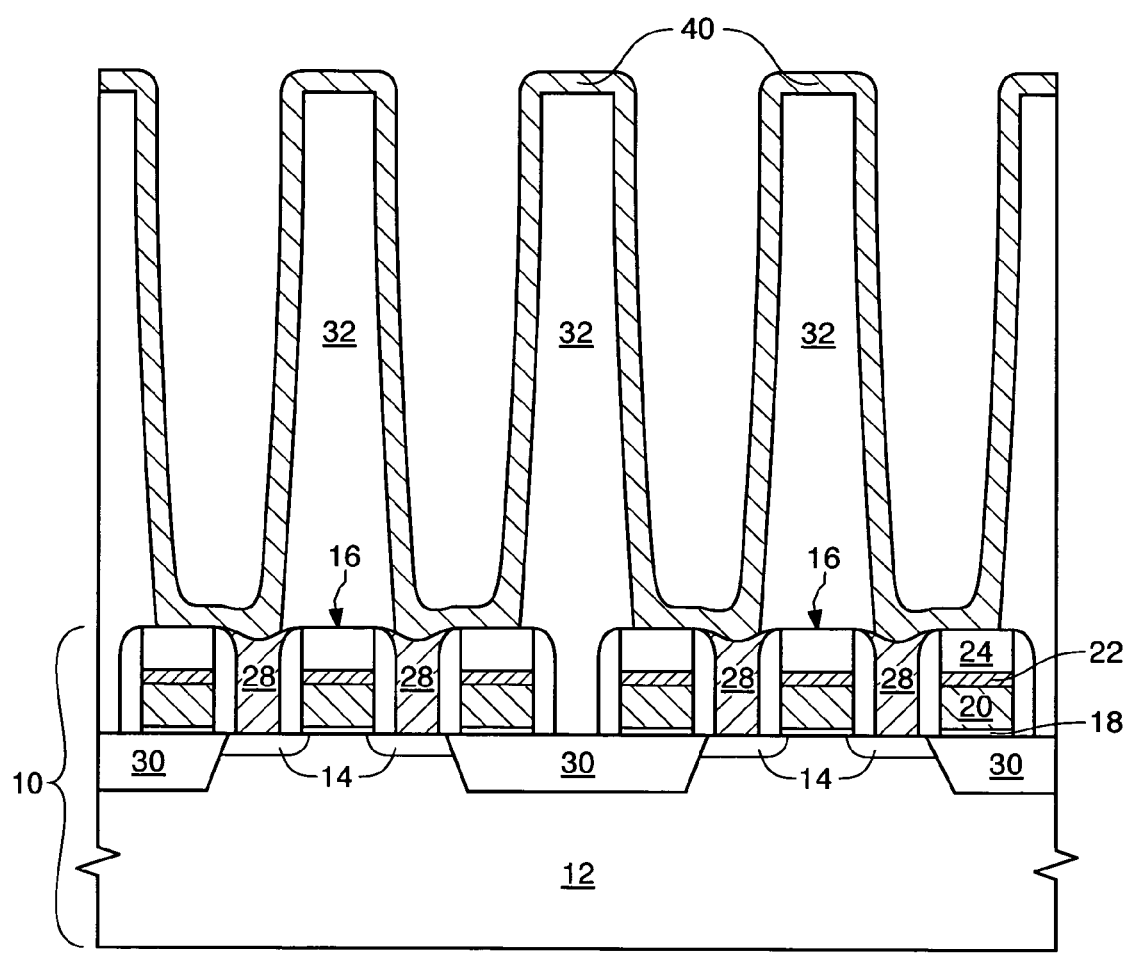
FIGS. 6-9 are cross sections depicting an embodiment of the present invention.

One embodiment of a use of the etch of the present invention is depicted in FIGS. 6-9. FIG. 6 depicts a semiconductor wafer substrate assembly 10 comprising a semiconductor wafer 12 having a plurality of doped source/drain areas 14 which allow proper operation of a plurality of transistors 16. Each transistor comprises gate oxide 18, a doped polysilicon control gate 20, silicide 22 such as tungsten silicide to increase conductivity of the control gate, and a capping layer 24 of oxide, for example formed using tetraethyl orthosilicate (TEOS). Silicon nitride spacers 26 insulate the control gate 20 and silicide 22 from polysilicon pads 28 to which the container capacitors will be electrically coupled. Further depicted in FIG. 6 is shallow trench isolation (STI, field oxide) 30 which reduces unwanted electrical interaction between adjacent transistors, and a thick layer of deposited oxide 32 such as borophosphosilicate glass (BPSG) having a plurality of etched openings therein. A conformal capacitor bottom plate layer 40 is formed over the surface of dielectric 32 to contact the polysilicon pads 28 as depicted. The FIG. 6 structure may further include other structural elements or differences which, for simplicity of explanation, have not been depicted.

The openings in the dielectric layer 32 will typically have an aspect ratio of 4:1 or greater (the depth of the opening is at least four times the diameter) and, with current processing techniques, may have an aspect ratio of 10:1 or more. The etch described below relies on topography to function in the manner identified, and polymer formation within the trench is not believed to be a factor in the lack of etch of the conductive layer within the trench. While the minimum workable aspect ratio has not been determined, an aspect ratio of 4:1 or greater will function sufficiently as described. For the present embodiment, the depth of the opening is about 16,000 angstroms (Å), and the width of the opening is about 4,000 Å, resulting in an aspect ratio of about 4:1.

The conformal capacitor bottom plate layer 40 may be a titanium metal layer, a layer comprising titanium such as titanium nitride, or a conductively doped polysilicon layer. In this exemplary embodiment, layer 40 will be between about 75 Å and about 250 Å thick. These layers are formed by techniques known in the art, for example using chemical vapor deposition (CVD).

Subsequently, the FIG. 6 structure is exposed to an inventive plasma dry etch which removes layer 40 from only the upper planarized surface of dielectric 32, and only minimally etches, or does not etch, layer 40 within the openings in the dielectric layer 32. This etch results in the structure of FIG. 7.

The present inventive etch comprises the introduction of chlorine gas ($Cl_2$), or boron trichloride ($BCl_3$) into a processing chamber such as an inductively coupled plasma/transformer coupled plasma (ICP/TCP) etch chamber at a flow rate of 0 standard cubic centimeters/minute (sccm) up to about 12 standard cubic centimeters/minute (sccm) or less, for example up to about 10 sccm. Flow rates over about 12 sccm are expected to increase the etch rate of the conductive layer within each opening, which effect is generally to be avoided.

Further, helium is introduced into the chamber as a diluent at a flow rate of between about 0 sccm to about 200 sccm and, more preferably, to between about 75 sccm and about 200 sccm. (As is known by one of ordinary skill in the art, at a gas flow rate of 0 sccm some gas is injected into the chamber due to the relatively lower chamber pressure with low pressure processes.) Ambient pressure within the chamber is maintained to between about 4 millitorr (mT) to about 6 mT, with a tolerance of about ±10%, TCP power is maintained to between about 150 watts (W) and about 1,000 W, and more preferably to between about 250 W and 1,000 W, and bias power is set to between about 0 W and about 300

W. During the etch process, the temperature proximate the semiconductor wafer substrate assembly is maintained to between about 20° C. and about 90° C.

With the settings described above, the etch is expected to remove titanium metal and titanium nitride at a rate of between about 10 Å/sec to about 30 Å/sec, and polysilicon at a rate of between about 15 Å/sec and about 30 Å/sec. It is estimated that this etch will remove the conductive layer from over the planarized upper surface while leaving all or substantially all of the conformal conductive layer within each opening. For purposes of this disclosure, leaving "substantially all" of the material within the opening suggests that an etch rate of the material outside each opening (i.e. the material over the horizontal upper surface of the dielectric) relative to the etch rate of the material inside each opening in the dielectric will be about 50:1 or greater.

Optionally, a fluorine-containing compound may be introduced into the processing chamber, for example after termination of the flow of the $Cl_2$ or $BCl_3$, to adjust process selectivity to layers under the titanium-containing film. For example, sulfur hexafluoride ($SF_6$) or nitrogen trifluoride ($NF_3$) may be introduced at a flow rate of between about 0 sccm and about 10 sccm to etch a dielectric or other material underlying the bottom plate layer 40 once the bottom plate layer is cleared from the planarized surface.

Figure 7:
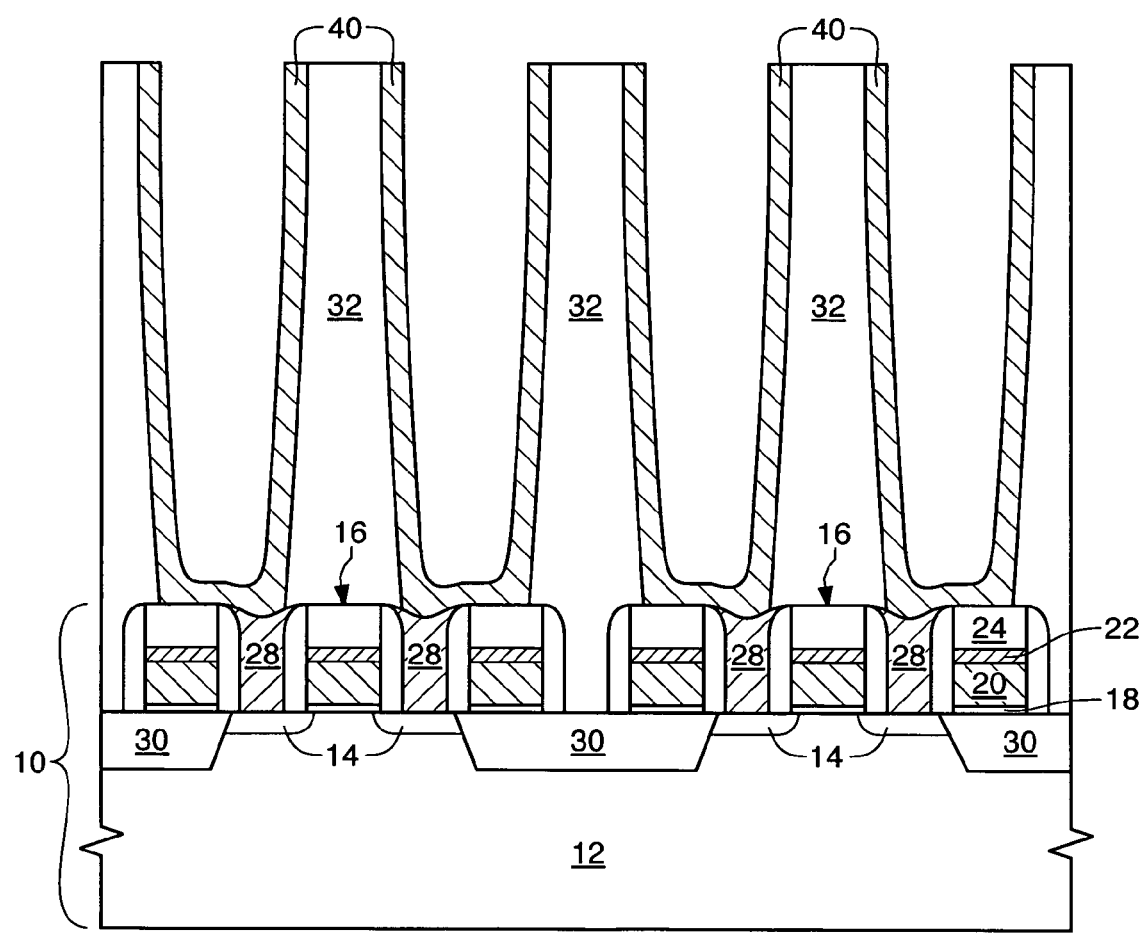
Figure 8:
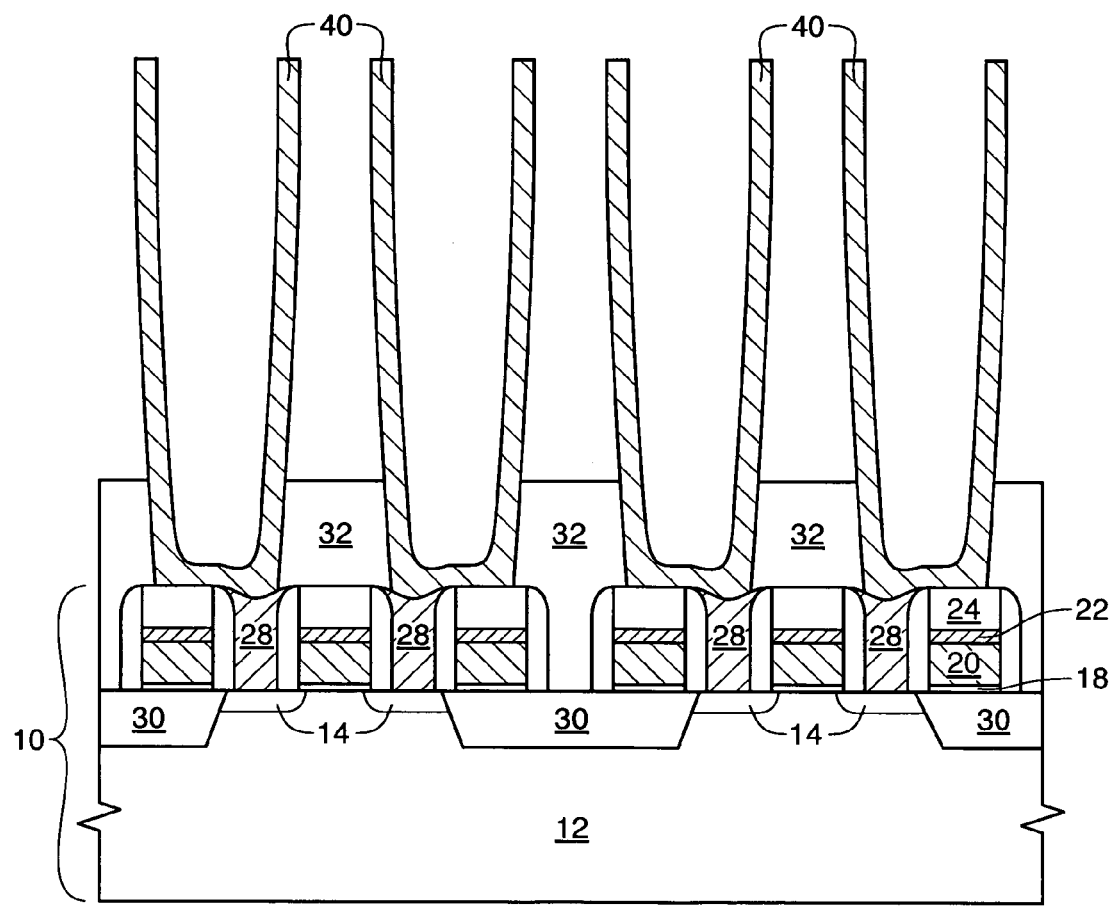
Figure 9:
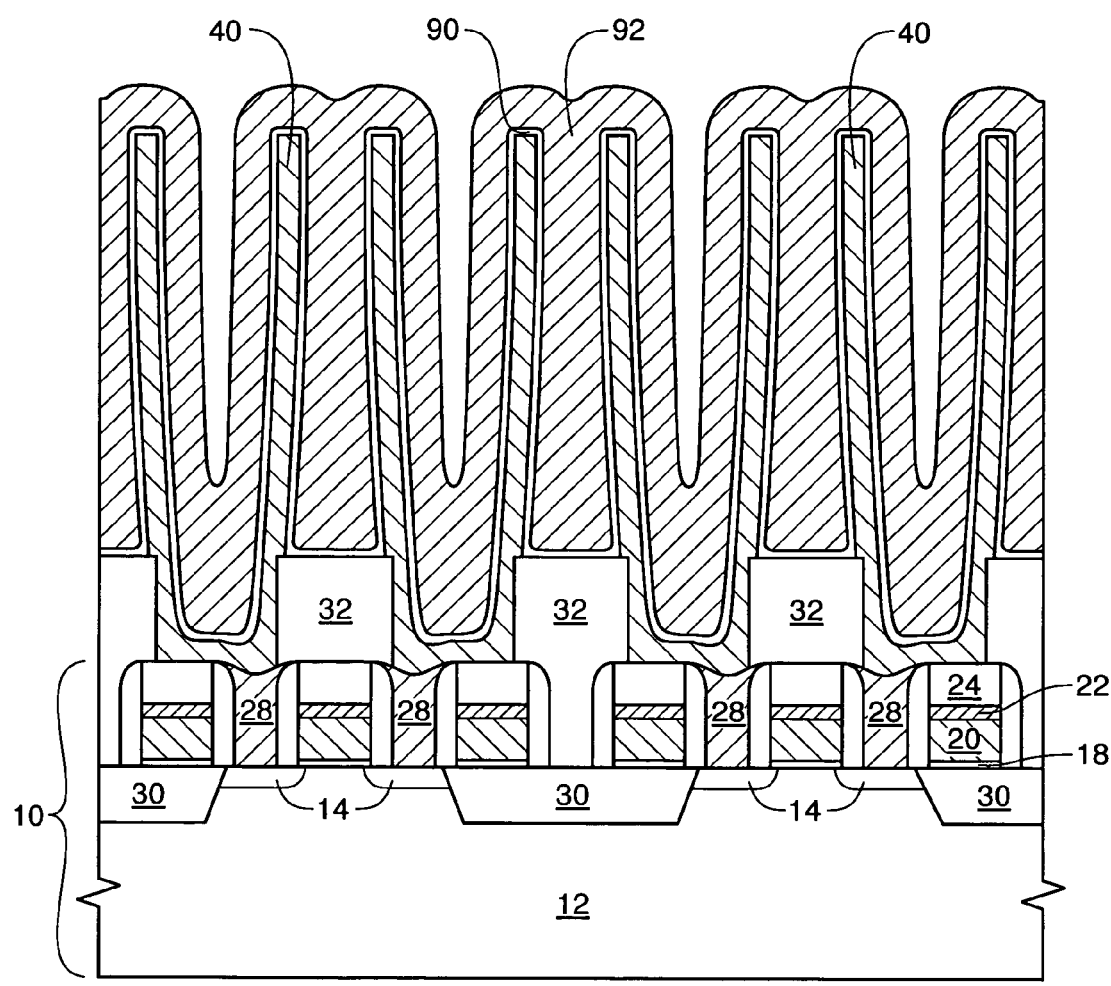

After forming the FIG. 7 structure, the capacitor may be completed by forming a capacitor cell dielectric and a capacitor top plate as known in the art to form single sided capacitors (i.e. capacitors with the top plate conformal along only one surface of the bottom plate). Optionally, an etch of the dielectric layer 32 may be performed which is selective to the bottom plate layer to expose the outside of the container capacitor as depicted in FIG. 8, for example to form a double-sided container capacitor. Various etchants which will etch BPSG selective to the bottom plate layer are known in the art, for example hydrofluoric acid (HF). After forming the FIG. 8 structure, a capacitor cell dielectric 90 and a capacitor top plate 92 are formed as depicted in FIG. 9, then wafer processing continues to form a completed semiconductor device comprising double-sided storage capacitors.

Figure 10:
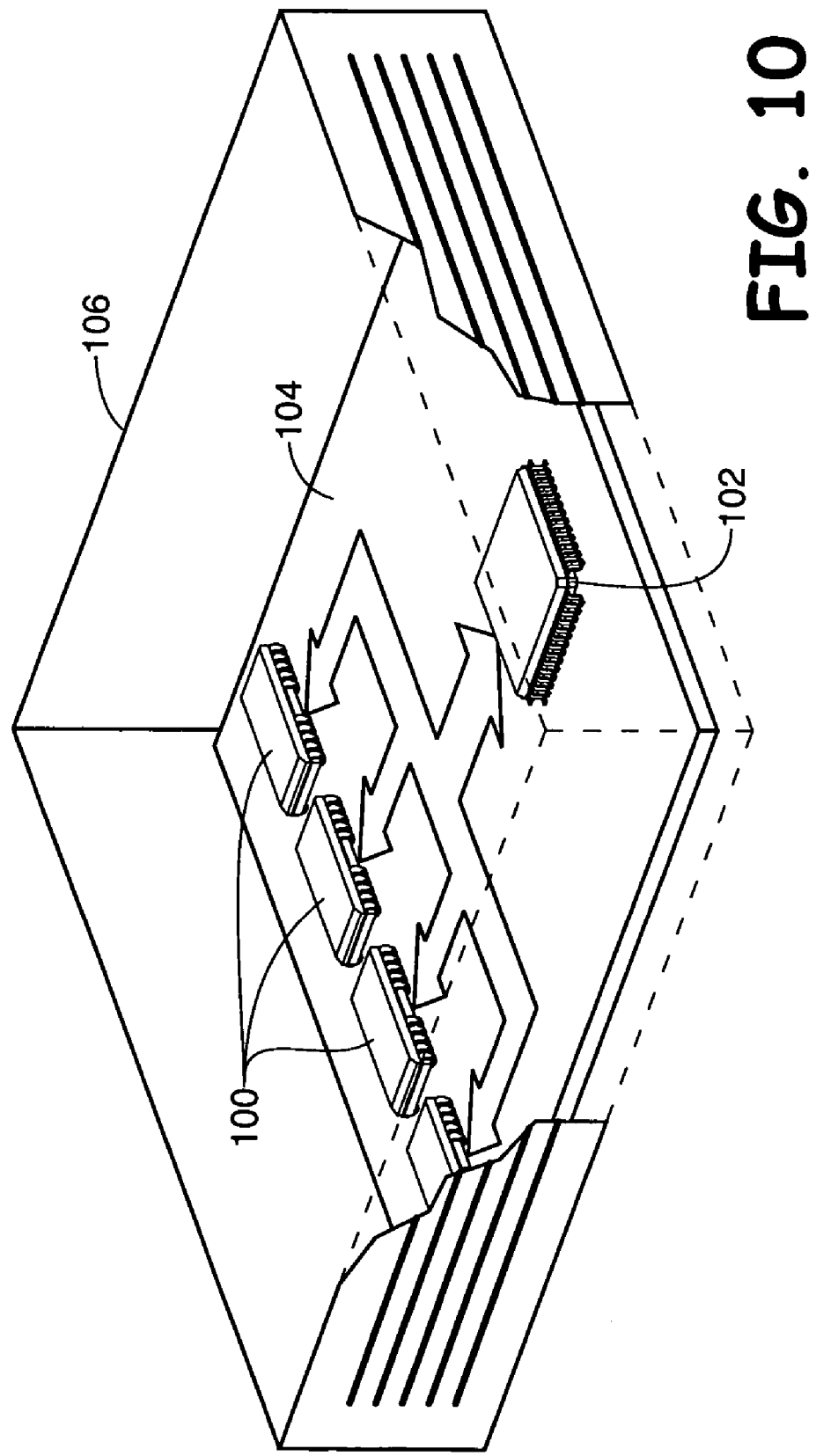
FIG. 10 is an isometric depiction of various components which may be manufactured using devices formed with an embodiment of the present invention.

As depicted in FIG. 10, a semiconductor device 100 including structures formed in accordance with the invention may be attached along with other devices such as a microprocessor 102 to a printed circuit board 104, for example to a computer motherboard or as a part of a memory module used in a personal computer, a minicomputer, or a mainframe 106. FIG. 10 may also represent use of device 100 in other electronic devices comprising a housing 106, for example devices comprising a microprocessor 102, related to telecommunications, the automobile industry, semiconductor test and manufacturing equipment, consumer electronics, or virtually any piece of consumer or industrial electronic equipment.

Figure 11:
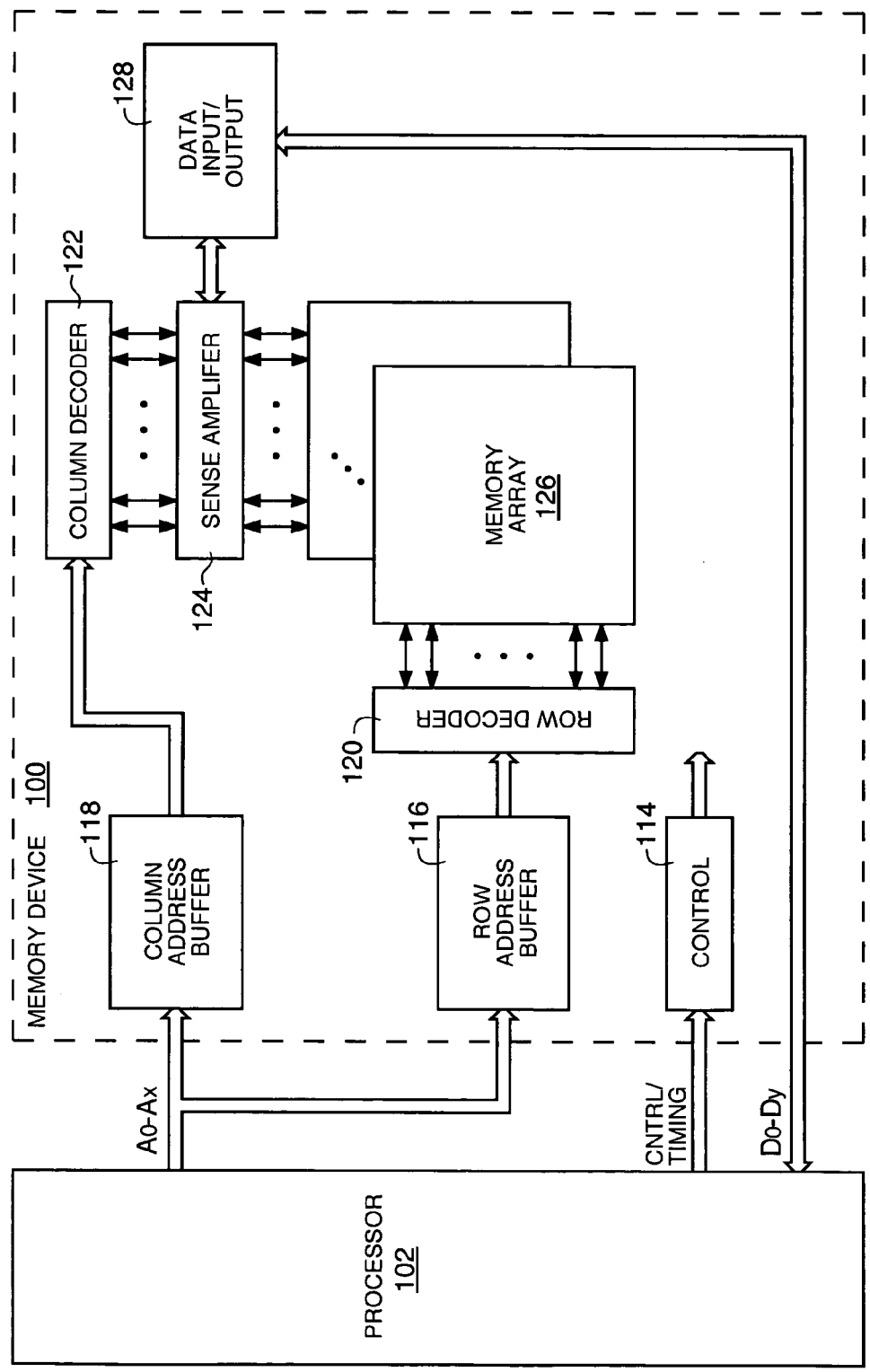
FIG. 11 is a block diagram of an exemplary use of the invention to form part of a memory device having a storage transistor array.

The process and resulting structure described herein may be used to manufacture a number of different devices. FIG. 11, for example, is a simplified block diagram of a memory device such as a dynamic random access memory having storage capacitors and/or contacts which may be formed using an embodiment of the present invention. The general operation of such a device is known to one skilled in the art. FIG. 11 depicts a processor 102 coupled to a semiconductor device 100 in the form of a memory device, and further depicts the following basic sections of a memory integrated circuit: control circuitry 114; row 116 and column 118 address buffers; row 120 and column 122 decoders; sense amplifiers 124; memory array 126; and data input/output 128.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for use during fabrication of a semiconductor device, comprising:
   forming a dielectric layer over a semiconductor wafer substrate assembly, the dielectric layer comprising an upper surface and one or more openings therein;
   forming a first portion of a conformal conductive layer over the upper surface of the dielectric and a second portion of the conformal conductive layer within each of the one or more openings in the dielectric layer; and
   with both the first and second portions of the conformal conductive layer exposed, exposing the conformal conductive layer over the upper surface to an etch to remove the first portion of the conformal conductive layer and to leave all or substantially all of the second portion of the conformal conductive layer within each of the one or more openings in the dielectric layer, the etch comprising:
   exposing the semiconductor wafer substrate assembly to an etch gas selected from the group consisting of $Cl_2$ and $BCl_3$; and
   during the exposure of the semiconductor wafer substrate assembly to the etch gas, exposing the semiconductor wafer substrate assembly to a diluent.

2. The method of claim 1 further comprising introducing the etch gas into a processing chamber containing the semiconductor wafer substrate assembly at a flow rate of about 12 sccm or less.

3. The method of claim 1 further comprising selecting the diluent to be helium.

4. The method of claim 1 further comprising maintaining an ambient pressure within a processing chamber containing the semiconductor wafer substrate assembly of between about 4 millitorr and about 6 millitorr at a tolerance of ±10% during the exposure of the semiconductor wafer substrate assembly to the etch gas.

5. The method of claim 1 further comprising maintaining a TCP power of between about 150 watts and about 1,000 watts during the exposure of the semiconductor wafer substrate assembly to the etch gas.

6. The method of claim 1 further comprising maintaining a bias power of between about 0 watts and about 300 watts during the exposure of the semiconductor wafer substrate assembly to the etch gas.

7. The method of claim 1 further comprising maintaining an ambient temperature of between about 20° C. and about 90° C. proximate the semiconductor wafer substrate assembly during the exposure of the semiconductor wafer substrate assembly to the etch gas.

8. The method of claim 1 further comprising exposing the semiconductor wafer substrate assembly to a fluorine-containing compound subsequent to removing the conformal conductive layer from over the upper surface.

9. The method of claim 1 further comprising selecting the conformal conductive layer to comprise one of titanium or polysilicon.

10. The method of claim 1 further comprising forming each of the one or more openings in the dielectric layer to exhibit an aspect ratio of 4:1 or greater.

11. The method of claim 1 further comprising exposing both the first and second portions of the conformal conductive layer to the etch during the exposure of the conformal conductive layer to the etch.

12. The method of claim 3 further comprising introducing the helium into a processing chamber containing the semiconductor wafer substrate assembly at a flow rate of between about 0 sccm and about 200 sccm.

13. The method of claim 3 further comprising introducing the helium into a processing chamber containing the semiconductor wafer substrate assembly at a flow rate of between about 75 sccm and about 200 sccm.

14. A method used during fabrication of a semiconductor device, comprising:
    forming a dielectric layer over a semiconductor wafer substrate assembly, the dielectric layer comprising an upper surface and one or more openings therein, wherein each of the one or more openings in the dielectric layer comprises an aspect ratio of 4:1 or greater;
    forming a conformal conductive layer comprising a material selected from the group consisting of titanium and polysilicon on the upper surface of the dielectric layer and within each of the one or more openings in the dielectric layer;
    within a processing chamber, and with the conformal conductive layer on the upper surface of the dielectric layer and within each of the one or more openings in the dielectric layer exposed, exposing the conformal conductive layer to an etch to remove the conformal conductive layer from over the upper surface of the dielectric layer and to leave all or substantially all of the conformal conductive layer within each of the one or more openings in the dielectric layer, the etch comprising:
        introducing an etch gas selected from the group consisting of $Cl_2$ and $BCl_3$ into the processing chamber at a flow rate of about 12 sccm or less;
        introducing a helium as a diluent into the processing chamber at a flow rate of between about 0 sccm and about 200 sccm;
        maintaining an ambient pressure within the processing chamber of between about 4 millitorr and about 6 millitorr at a tolerance of ±10%;
        maintaining a TCP power of between about 150 watts and about 1,000 watts;
        maintaining a bias power of between about 0 watts and about 300 watts; and
        maintaining a temperature of between about 20° C. and about 90° C. proximate the semiconductor wafer substrate assembly.

15. The method of claim 14 wherein the helium is introduced into the processing chamber at a flow rate of between about 75 sccm and about 200 sccm.

16. The method of claim 14 wherein the etch forms an etched conductive layer and the method further comprises:
    forming a capacitor cell dielectric layer on the etched conductive layer; and
    forming a capacitor top plate on the capacitor cell dielectric layer.

17. A method for forming an electronic device, comprising:
    providing a semiconductor device formed using a method comprising:
        forming a dielectric layer over a semiconductor wafer substrate assembly, the dielectric layer comprising an upper surface and one or more openings therein;
        forming a first portion of a conformal conductive layer over the upper surface of the dielectric and a second portion of the conformal conductive layer within each of the one or more openings in the dielectric layer;
        within a processing chamber and with both the first and second portions of the conformal conductive layer exposed, exposing the conformal conductive layer over the upper surface to an etch to remove the first portion of the conformal conductive layer and to leave all or substantially all of the second portion of the conformal conductive layer within each of the one or more openings in the dielectric layer, the etch comprising:
            introducing an etch gas selected from the group consisting of $Cl_2$ and $BCl_3$ into the processing chamber;
            during the introduction of the etch gas into the processing chamber, introducing a diluent into the processing chamber; and
    attaching the semiconductor device to an electrical circuit to electrically communicate with at least one microprocessor as part of an electronic device.

18. The method of claim 17 further comprising introducing the etch gas into the processing chamber at a flow rate of about 12 sccm or less.

19. The method of claim 17 further comprising maintaining an ambient pressure within the processing chamber of between about 4 millitorr and about 6 millitorr at a tolerance of ±10% during the introduction of the etch gas into the processing chamber.

20. The method of claim 17 further comprising maintaining a TCP power of between about 150 watts and about 1,000 watts during the introduction of the etch gas.

21. The method of claim 17 further comprising maintaining a bias power of between about 0 watts and about 300 watts during the introduction of the etch gas.

22. The method of claim 17 further comprising selecting the conformal conductive layer to comprise one of titanium or polysilicon.

23. The method of claim 17 further comprising forming each of the one or more openings in the dielectric layer to exhibit an aspect ratio of 4:1 or greater.

24. The method of claim 17 further comprising exposing both the first and second portions of the conformal conductive layer to the etch during the exposure of the conformal conductive layer to the etch.

25. A method used during fabrication of a semiconductor device, comprising:
    forming a dielectric layer over a semiconductor wafer substrate assembly, the dielectric layer comprising an upper surface and one or more openings therein, wherein each of the one or more openings in the dielectric layer comprises an aspect ratio of 4:1 or greater;
    forming a conformal conductive layer comprising a material selected from the group consisting of titanium and polysilicon having a first portion on the upper surface of the dielectric layer and a second portion within each of the one or more openings in the dielectric layer;

within a processing chamber, and with both the first and second portions of the conformal conductive layer exposed, exposing both the first and second portions of the conformal conductive layer to an etch to remove the first portions of the conformal conductive layer from over the upper surface of the dielectric layer and to leave all or substantially all of the second portions of the conformal conductive layer within each of the one or more openings in the dielectric layer, the etch comprising:
   introducing an etch gas selected from the group consisting of $Cl_2$ and $BCl_3$ into the processing chamber at a flow rate of about 12 sccm or less;
   introducing a helium as a diluent into the processing chamber at a flow rate of between about 0 sccm and about 200 sccm;
   maintaining an ambient pressure within the processing chamber of between about 4 millitorr and about 6 millitorr at a tolerance of ±10%;
   maintaining a TCP power of between about 150 watts and about 1,000 watts;
   maintaining a bias power of between about 0 watts and about 300 watts; and
   maintaining a temperature of between about 20° C. and about 90° C. proximate the semiconductor wafer substrate assembly.

26. The method of claim 25 further comprising exposing both the first and second portions of the conformal conductive layer to the etch during the exposure of the conformal conductive layer to the etch.

* * * * *